United States Patent
Pierreux et al.

(10) Patent No.: US 10,199,223 B2
(45) Date of Patent: Feb. 5, 2019

(54) SEMICONDUCTOR DEVICE FABRICATION USING ETCH STOP LAYER

(71) Applicant: ASM IP Holding B.V., Almere (NL)

(72) Inventors: Dieter Pierreux, Dilbeek (BE); Werner Knaepen, Leuven (BE); Bert Jongbloed, Oud-Heverlee (BE)

(73) Assignee: ASM IP HOLDING B.V., Almere (NL)

( * ) Notice: Subject to any disclaimer, the term of this patent is extended or adjusted under 35 U.S.C. 154(b) by 0 days.

(21) Appl. No.: 15/413,848

(22) Filed: Jan. 24, 2017

(65) Prior Publication Data

US 2017/0213732 A1    Jul. 27, 2017

Related U.S. Application Data

(60) Provisional application No. 62/287,359, filed on Jan. 26, 2016.

(51) Int. Cl.
    *H01L 21/033* (2006.01)

(52) U.S. Cl.
    CPC ...... *H01L 21/0337* (2013.01); *H01L 21/0332* (2013.01); *H01L 21/0335* (2013.01)

(58) Field of Classification Search
    CPC ............ H01L 21/0337; H01L 21/0332; H01L 21/0335; H01L 21/02274
    See application file for complete search history.

(56) References Cited

U.S. PATENT DOCUMENTS

| | | | |
|---|---|---|---|
| 6,194,323 B1 | 2/2001 | Downey et al. | |
| 6,482,726 B1 | 11/2002 | Aminpur et al. | |
| 7,279,427 B2 * | 10/2007 | Nishino | H01L 21/02063 438/706 |
| 8,946,721 B2 | 2/2015 | Henson | |
| 2001/0005631 A1 | 6/2001 | Kim et al. | |
| 2003/0181054 A1 * | 9/2003 | Lee | H01L 21/31116 438/709 |
| 2004/0091789 A1 | 5/2004 | Han et al. | |
| 2007/0128823 A1 * | 6/2007 | Lee | H01L 21/0337 438/396 |
| 2009/0194845 A1 * | 8/2009 | Werner | H01L 27/10852 257/532 |

OTHER PUBLICATIONS

Christensen, C. et al.: "Tantalum oxide thin films as protective coatings for sensors," Twelfth IEEE International Conference on Micro Electro Mechanical Systems, 1999, pp. 267-272.

Jiang, F. et al.: "Tantalum oxide thin films for microelectronic applications," Thesis, Rochester Institute of Technology, 1995, pp. 101-104.

* cited by examiner

*Primary Examiner* — Jasmine Clark
(74) *Attorney, Agent, or Firm* — Knobbe Martens Olson & Bear LLP

(57) ABSTRACT

An etch stop layer comprises a metal oxide comprising a metal selected from the group consisting of metals of Group 4 of the periodic table, metals of Group 5 of the periodic table, metals of Group 6 of the periodic table, and yttrium. The metal oxide forms exceptionally thin layers that are resistant to ashing and HF exposure. Subjecting the etch stop layer to both ashing and HF etch processes removes less than 0.3 nm of the thickness of the etch stop layer, and more preferably less than 0.25 nm. The etch stop layer may be thin and may have a thickness of about 0.5-2 nm. In some embodiments, the etch stop layer comprises tantalum oxide (TaO).

18 Claims, 6 Drawing Sheets

SEMICONDUCTOR DEVICE FABRICATION USING ETCH STOP LAYER

REFERENCE TO RELATED APPLICATION

This application claims the priority benefit under 35 U.S.C. § 119(e) of provisional Application No. 62/287,359, filed Jan. 26, 2016, the entire disclosure of which is incorporated herein by reference.

BACKGROUND

Field

This invention relates to semiconductor device fabrication and, more particularly, to processes using etch stop layers.

Description of the Related Art

Semiconductor device fabrication processes, e.g., for making integrated circuits, may involve various pattern transfer steps in which an etch process is used to transfer a pattern in a masking layer into an underlying target layer. To prevent undesired etching or damage to material that underlies the target layer, an etch stop may be provided between the target layer and the underlying material to be protected. As the features of semiconductor devices have become ever smaller, the requirements for the etch stops have become more stringent. Accordingly, there is a continuing need to develop etch stops compatible with the fabrication of modern semiconductor devices.

SUMMARY

In some aspects, a method for making a semiconductor device is provided. The method comprises providing a substrate and providing an etch stop layer over the substrate. The etch stop layer comprises tantalum oxide. The method further comprises exposing the etch stop layer to an oxygen plasma.

In some other aspects, a semiconductor device comprises a template comprising a pattern of separated features and an etch stop layer underlying the template. The etch stop layer comprises tantalum oxide and has a thickness of 0.5 to 2 nm.

In yet other aspects, a method for making a semiconductor device is provided. The method includes providing a substrate and providing an etch stop layer over the substrate. The etch stop layer comprises tantalum oxide and has a thickness of 0.5-2.0 nm. A target layer is provided on the etch stop layer, and a pattern is formed in the target layer. Forming the pattern comprises exposing the target layer to an oxygen-containing plasma to form openings extending through the target layer, where the etch stop layer is exposed to the oxygen-containing plasma in the openings.

In some other aspects, a method for making a semiconductor device is provided. The method comprises providing a substrate and providing an etch stop layer over the substrate. The etch stop layer has a thickness of 0.5-2.0 nm. The etch stop layer is exposed to an oxygen-plasma and also to hydrogen fluoride. A thickness of 0.3 nm or less of the etch stop layer is removed by exposing the etch stop layer to an oxygen-plasma and exposing the etch stop layer to hydrogen fluoride.

In some other aspects, a semiconductor device comprises a template comprising a pattern of separated features and an etch stop layer underlying the template. The etch stop layer has a thickness of 0.5 to 2 nm and comprises a metal oxide comprising a metal selected from the group consisting of metals of Group 4 of the periodic table, metals of Group 5 of the periodic table, metals of Group 6 of the periodic table, and yttrium.

BRIEF DESCRIPTION OF THE DRAWINGS

The drawings are provided to illustrate example embodiments and are not intended to limit the scope of the disclosure. Like numerals and like shading refer to like parts throughout. In addition, features in the drawings are not necessarily to scale.

DETAILED DESCRIPTION

Figure 1:
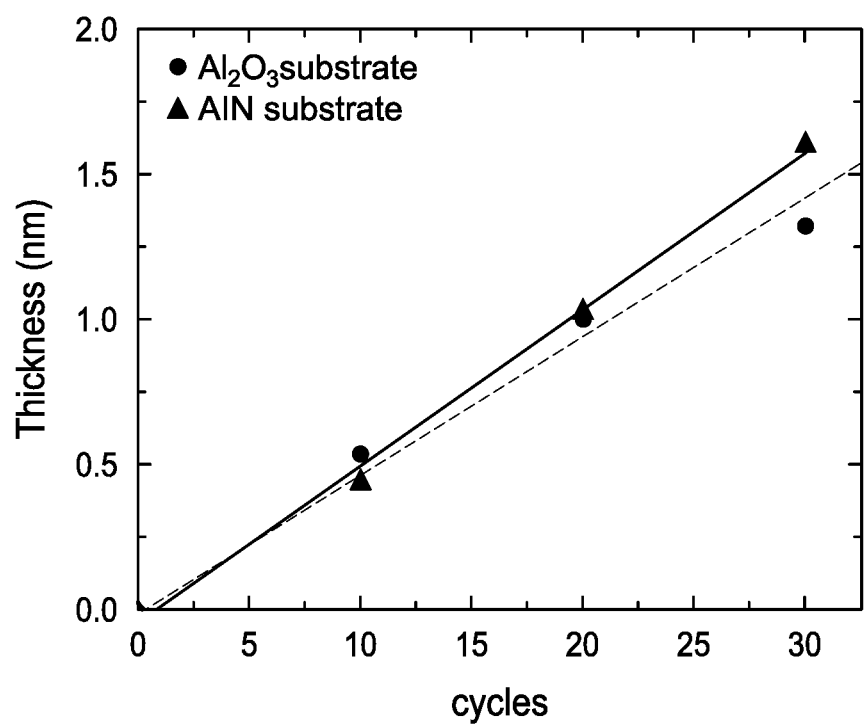
FIG. 1 shows a plot of the thickness of a TaO film as a function of the number of atomic layer deposition cycles performed on various substrates.

Etch stop layers may be used to protect underlying materials from etch chemistries that are applied to remove all or portions of overlying materials. Preferably, the etch stop layers are sufficiently resistant to the etch chemistries such that they are not removed after the desired etching of the overlying materials is completed. One approach for forming etch stop layers with sufficient resistance to removal is to simply form layers with large thicknesses. Such thick layers, however, may not be suitable for modern semiconductor devices. In addition, the etch stop layers may be subjected to multiple etch chemistries and, thus, it may be desirable for the etch stop layer to be resistant to each of these multiple chemistries. The competing goals of thinness and high etch resistance to one or more different etch chemistries can make the development of suitable etch stop layers challenging.

An example of such competing goals occurs in semiconductor fabrication processes in which carbon-containing layers are used as patterning templates, or etch masks. An example of a carbon-containing layer is an amorphous carbon layer or a photoresist layer.

The carbon-containing layer may be on a substrate and may be patterned by exposure to an oxygen-containing plasma. Etch processes using oxygen-containing plasma may also be referred to as ashing processes. An etch stop layer may be used to protect the underlying substrate from the oxygen-containing plasma. Because oxygen-containing plasmas are typically aggressive, when using conventional etch stop materials such as silicon nitride, silicon oxynitride, or silicon carbide, the etch stop layer typically needs to have a large minimum thickness to provide adequate protection for the underlying substrate. An etch stop layer having a low thickness has the advantage that more space remains available for other functional layers in the device, which is particularly desirable when the etch stop layer is not removed and remains in the final device, and also when the etch stop layer is used in the fabrication of devices with small feature sizes. Conventional materials used in etch stop layers for ashing have been found to oxidize to some extent and the oxides can withstand the oxygen plasma of the ashing process. This requires the original etch stop layer to have a certain thickness, however, since part of the layer is consumed and converted into the oxide.

After exposure to the oxygen-containing plasma, a wet etch in diluted hydrogen fluoride (HF) is typically applied to remove any residual material, including etch mask material. Therefore, after exposure to the oxygen-containing plasma, the etch stop layer is preferably also HF resistant to prevent the underlying substrate from being etched by HF. Undesirably, in general, oxides have a poor resistance to HF etching.

In addition, it will be appreciated that, to provide adequate protection for the substrate, the etch stop layer should be completely closed. During the deposition of conventional etch stop layers, however, a certain minimum thickness may be needed after nucleation of the deposited etch stop film before the film is completely closed.

In view of the various factors above, conventional etch stop layers typically need to have thicknesses of 5 nm or more to provide adequate protection for a substrate.

Advantageously, etch stop layers according to some embodiments provide high resistance to ashing and to HF exposure, while being exceptionally thin. Preferably, in some embodiments, the thickness of the etch stop layer may be about 0.5-2 nm, more preferably about 0.5-1.5 nm, most preferably about 0.5 nm-1.0 nm. Subjecting the etch stop layer to both ashing and HF etch processes preferably removes less than 0.3 nm of the thickness of the etch stop layer, and more preferably less than 0.25 nm. This resistance to the HF etch is preferably observed for etches of at least 0.5 minute or at least 1 minute, and more preferably, at least 2 minutes, at least 3 minutes, or at least 4 minutes. In some embodiments, the etch stop layer is etched by the HF solution at a rate that is at least 25 times less, at least 35 times less, or at least 50 times less the rate at which an underlying material (e.g., $Al_2O_3$) is etched. The etch resistance is preferably observed at least when the etch stop is subjected to an HF etch using an aqueous 0.5% HF solution. Preferably, the HF etch is performed under standard conditions of room temperature and atmospheric pressure.

In some embodiments, the etch stop layer comprises a metal oxide. Preferably, the etch stop layer is formed of tantalum oxide (TaO), which has been found to be exceptionally resistant to ashing and HF exposure, while allowing uniform deposition results even at low thicknesses. In some embodiments, the etch stop layer is a tantalum oxide layer that is stoichiometric ($Ta_2O_5$, or $Ta_2O_3$) or that may contain small concentrations, e.g., 0-20 at %, of other elements, such as nitrogen, carbon, hydrogen and chlorine. It will be understood that the term TaO encompasses all these compositions.

In some other embodiments, the etch stop layer may comprise a metal oxide with other metals from Group 5b of the periodic table, or metals from Groups 4b or 6b. Examples of other Group 5b elements include vanadium (V) and niobium (Nb); examples of Group 4b elements include Hf, Zr and Ti; and examples of Group 6b elements include chromium (Cr), molybdenum (Mo), and tungsten (W). In some other embodiments, the etch stop layer comprises yttrium oxide. Preferably, these metal oxides have properties similar to TaO.

It will be appreciated that the etch stop layer may be formed by a deposition process, including vapor deposition processes such as chemical vapor deposition (CVD). In CVD, the substrate is exposed to mutually reactive precursors that react, e.g. in the gas phase, to deposit a compound comprising elements of those precursors on the substrate. Reaction conditions may be established to decompose the precursors before and/or upon contact with the substrate.

More preferably, the etch stop layer is deposited by atomic layer deposition (ALD). ALD-type processes are based on controlled, self-limiting surface reactions and can provide precise control of the film composition and layer thickness, and high conformality. Gas phase reactions are avoided by contacting, or exposing, the substrate alternately and sequentially with reactants. Vapor phase reactants are separated from each other in the reaction chamber, for example, by removing excess reactants and/or reactant byproducts from the reaction chamber between reactant pulses. Removing excess reactants and/or reactant byproducts may be achieved, for example, by purging the reaction space after each pulse of reactant gas using a vacuum and/or a purge gas. A purge gas may also be flowed continuously before, during, and after each pulse of reactant gas. For example, in some embodiments the purge gas may also serve as a carrier gas for one or more of the reactants. In some other embodiments, the alternating reactant exposures may be accomplished by movement of the substrate and/or reactor parts, without stopping and starting the flow of precursors into the deposition chamber to accomplish the alternating exposures. It will be appreciated that an exposure to a particular reactant may also be referred to as a "pulse," and "reactants" may also be referred to as "precursors." Exposure of the substrate to a sequence including each reactant for the deposition constitutes a deposition cycle; for example, where two reactants are utilized, exposing the substrate to a first and then a second reactant can constitute one deposition cycle.

Each reactant pulse in ALD is preferably self-limiting. An excess of reactant is supplied during the pulse to saturate the susceptible structure surfaces. In theory, surface saturation ensures reactant occupation of all available reactive sites (subject, for example, to physical size or "steric hindrance" restraints) and thus provides excellent step coverage. In some arrangements, the degree of self-limiting behavior can be adjusted by, e.g., allowing some overlap of reactant pulses to trade off deposition speed (by allowing some CVD-type reactions) against conformality. Ideal ALD conditions with reactants well separated in time and space provide self-limiting behavior and, thus, maximum conformality. In some embodiments, less than a complete monolayer is deposited in one or more cycles, for example due to steric hindrance. In some embodiments, more than one monolayer may be deposited by, for example, adjusting the deposition conditions to achieve some decomposition reaction, such as would occur in CVD or CVD-like processes. Limited CVD reactions mixed with the self-limiting ALD reactions can raise the deposition rate. The deposition cycles are repeated a desired number of times to form a layer of a desired thickness.

Deposition temperatures are preferably maintained below the precursor thermal decomposition temperature and below temperatures that may damage materials in the substrate, but at a high enough level to avoid condensation of reactants and to provide the activation energy for the desired surface reactions. The appropriate temperature window for any given ALD reaction will depend upon the surface termination and reactant species involved. The reaction temperature for the various atomic layer depositions herein may be in a range from about room temperature to about 500° C., including from about 20° C. to about 500° C., from about 100° C. to about 400° C., from about 150° C. to about 350° C., and from 150° C. to about 200° C. in some embodiments.

The reaction pressure may be from about 0.1 Torr to about 760 Torr. In some embodiments, the reaction pressure may be from about 0.5 Torr to about 10 Torr.

In some embodiments, depositions of TaO etch stop layers by ALD provide advantages over typical ALD processes. Typically, ALD processes are inflicted with an incubation time, meaning that in the initial deposition cycles little or no film thickness will be deposited. After a number of deposition cycles, the deposited thickness per cycle becomes constant and the film thickness linearly increases with the number of cycles.

Advantageously, as shown in FIG. 1, in some embodiments, the TaO ALD process does not have an incubation time and the film thickness increases linearly with the number of cycles from the very first deposition cycle onwards. It will be appreciated that this lack of an incubation time may provide manufacturing throughput advantages and may also facilitate the deposition of thin layers. FIG. 1 shows the thickness of a TaO film as a function of the number of atomic layer deposition cycles performed on various substrates. The deposited thickness per cycle was about 0.05 nm, with a slight variation depending on the substrate material on which the TaO film is deposited. The depositions were conducted on substrates with an exposed aluminum oxide ($Al_2O_3$) layer and substrates with an exposed aluminum nitride (AlN) layer. The Ta precursor used for the deposition was TBTDET, TertiaryButylimido, Tris(DiEthylamino)Tantalum, which has the chemical formula $Ta[N(C_2H_5)_2]_3[=NC(CH_3)_3]$. Although TBTDET is commonly used as a precursor for the deposition of TaN, it was found to be also a good precursor for the deposition of TaO. Other process conditions were:

Oxidant: $H_2O$ (or $O_3$)
Deposition temperature, $T_{dep}$=150-200° C.
Reactant pulse and purge durations, $H_2O(O_3)$/Purge/TBTDET/Purge(s): 15 s/30 s/15 s/8 s
$H_2O$ flow rate: 50 sccm; ($O_3$ flow rate: 3 slm)
TBTDET dosage: 0.15 g/min
Temperature of TBTDET vaporizer and supply line: 160° C.
Temperature TBTDET container: room temperature
Higher doses for the TBTDET may be used, e.g. 0.5 or 1.0 g/min.

In some embodiments, similar results, in particular rapid closure of the film, are obtained with other Ta precursors, including metalorganic precursors such as Ta precursors containing one or more amino and/or imido groups, or alkoxy tantalum precursors such as PEOTA (penta-ethyl-orto-tantalum) and derivatives thereof. Also, halide sources such as tantalum-penta-chloride are used in some embodiments.

Figure 2:
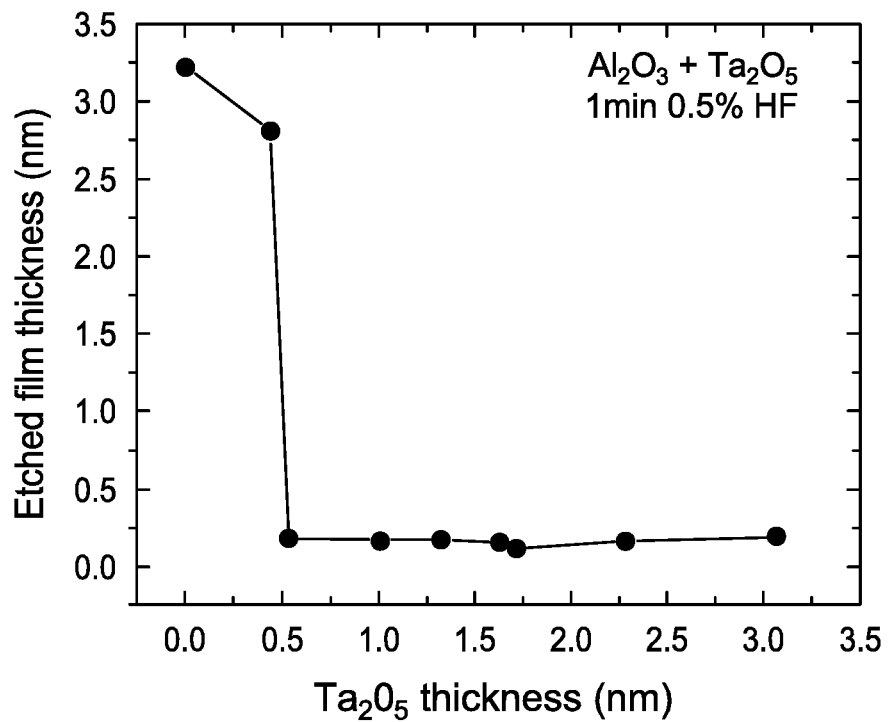
FIG. 2 shows a plot of the thickness of material removed from a material stack formed by an $Al_2O_3$ layer capped with a TaO layer after exposing the stack to hydrogen fluoride. The amount of material removed is shown as a function of TaO layer thickness.

For thin films used as etch stop layers, the thickness of the film that is needed to achieve complete closure of the film is significant. The impact of TaO thickness on HF resistance was investigated using TaO etch stop layers of various thicknesses, from 0.5 nm up to 3 nm thick TaO layers. FIG. 2 shows a plot of the thickness of material removed from a material stack formed by an $Al_2O_3$ layer capped with a TaO layer after exposing the stack to hydrogen fluoride. The amount of material removed is shown as a function of TaO layer thickness.

With continued reference to FIG. 2, TaO layers of various thicknesses were deposited on the $Al_2O_3$ layer, the TaO/$Al_2O_3$ stack was exposed to an aqueous solution of 0.5% HF for 1 min, and measurements were taken of the thickness of the stack that was etched away. It appeared that a film of 0.5 nm thickness was sufficient to withstand the 1 min. wet etching in the 0.5% HF aqueous solution. Increases in film thickness were not found to change the amount of material removed by exposure to the HF solution.

Figure 3:
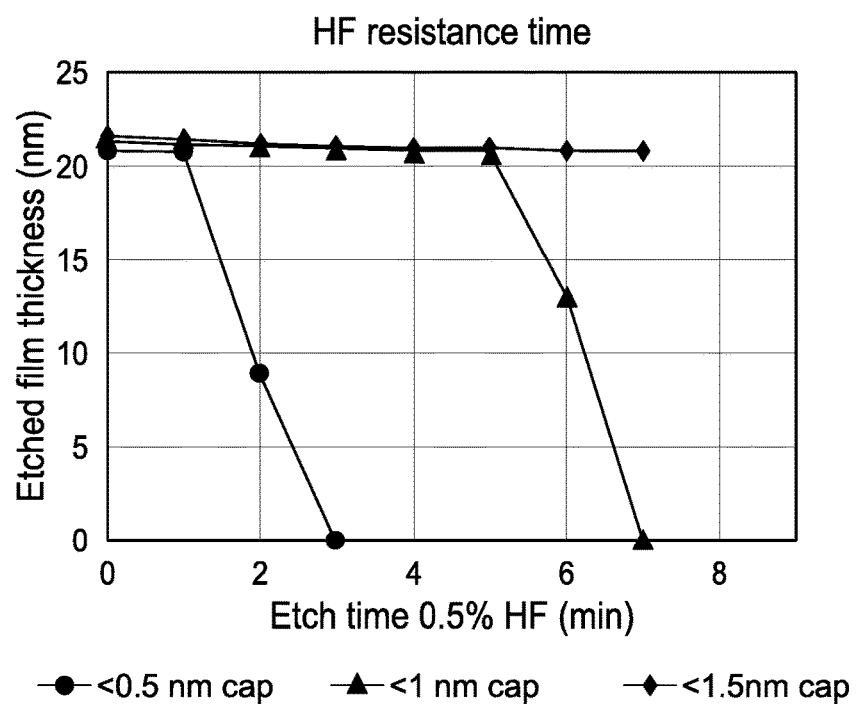
FIG. 3 shows a plot of the thickness of material remaining in material stacks formed by $Al_2O_3$ layers capped with 0.5, 1.0, and 1.5 nm thick TaO layers after exposing the stacks to hydrogen fluoride. The amount of material remaining in each stack is shown as a function of the duration of the exposure.
Figure 4:
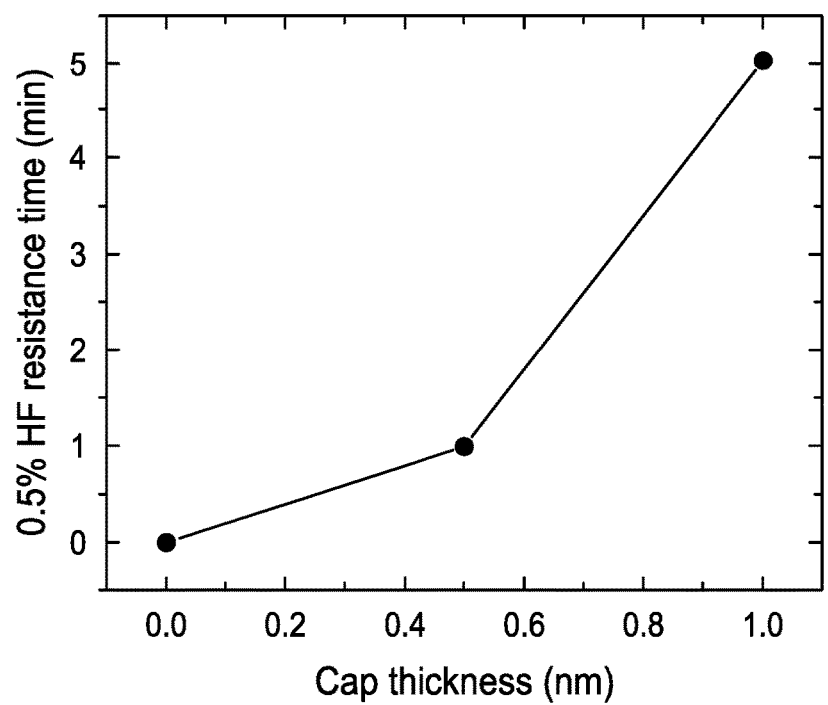
FIG. 4 shows a plot of the etch resistance time of a TaO layer as a function of TaO layer thickness, as derived from the data of FIG. 3.

The impact of etch times on the etch resistance of the TaO cap layer in a TaO/$Al_2O_3$ stack was also investigated. The stacks included TaO cap layers that were 0.5, 1.0 and 1.5 nm thick. The stacks were exposed to the 0.5% HF etch solution for durations varying from 1 to 7 minutes. The results are shown in FIG. 3, which shows the amount of material remaining in each stack as a function of the duration of the HF etch solution exposure. It can be seen that a 0.5 nm TaO layer can withstand etching in 0.5% HF for 1 min, a 1 nm TaO layer can withstand similar etching for 5 min, and a 1.5 nm TaO layer can withstand etching in 0.5% HF for 7 minutes or more. The duration that the TaO layer can withstand exposure to the HF solution may be referred to as the HF resistance time. Once the resistance time is exceeded and the etch breaks through the protective TaO cap layer, the total layer thickness decreased rapidly until the entire stack has etched away. It will be appreciated that this behavior is due to the much higher etch rate of $Al_2O_3$ compared to TaO. The TaO film is etched during exposure to 0.5% HF at a rate of 0.2 to 0.25 nm/min, whereas the $Al_2O_3$ etches at a 50 times higher rate of about 10 nm/min. It should be noted that the etch rate of the TaO layer can vary depending on thickness. For thick (>10 nm) TaO layers, the extracted etch rate of TaO was 0.12 nm/min. The results of FIG. 3 are summarized in FIG. 4, which shows a plot of the HF resistance time of a TaO layer as a function of TaO layer thickness. Preferably, the HF resistance time in 0.5% HF is 0.5 minute or more, or preferably 1 minute or more. It will be appreciated that the method and conditions used to deposit the etch stop have an influence on the properties of the oxide and the etch rate in HF. Preferably, the deposition of the TaO layer, or other etch stop layers disclosed herein, is chosen to achieve the HF resistance disclosed herein.

Figure 5:
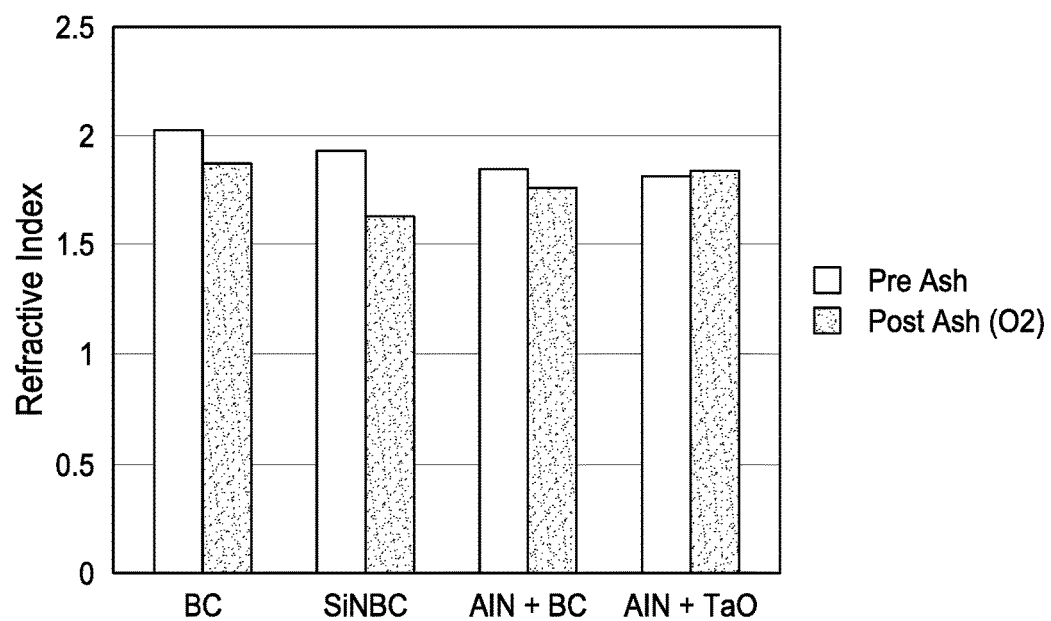
FIG. 5 shows a graph of the refractive index of various etch stop layers before and after exposure to an ashing process comprising exposure to an oxygen plasma.

The resistance of the TaO layer against ashing during exposure to an oxygen plasma was experimentally tested and compared with other layers that are typically used as etch stop layers. For this purpose, 3-4 nm thick layers of boron carbide (BC), silicon nitride containing boron and carbon (SiNBC), aluminum nitride capped with boron carbide (AlN+BC) and aluminum nitride capped with 1 nm of TaO (AlN+TaO) were deposited on 300 mm silicon substrates. The substrates were then exposed to an oxygen plasma for a duration of 5 min. at 300° C., with an RF power of 500 W. Before and after oxygen plasma exposure, the refractive index was measured. The results are shown in FIG. 5. It can be seen that, for BC, SiNBC and AlN+BC, the refractive index decreases as a result of the oxygen plasma exposure. This decrease indicates oxygen incorporation into the films as a result of the plasma exposure. When these films were subsequently exposed to HF, 0.5% for 1 min, the films were completely etched away. As noted herein, oxides can have poor resistance to etching by exposure to HF solutions. Advantageously, the AlN+TaO stack of some embodiments shows a different behavior: as a result of the oxygen plasma exposure, the refractive index does not decrease but rather seems to increase slightly, and the film was resistant to a subsequent Hf etching.

Figure 6:
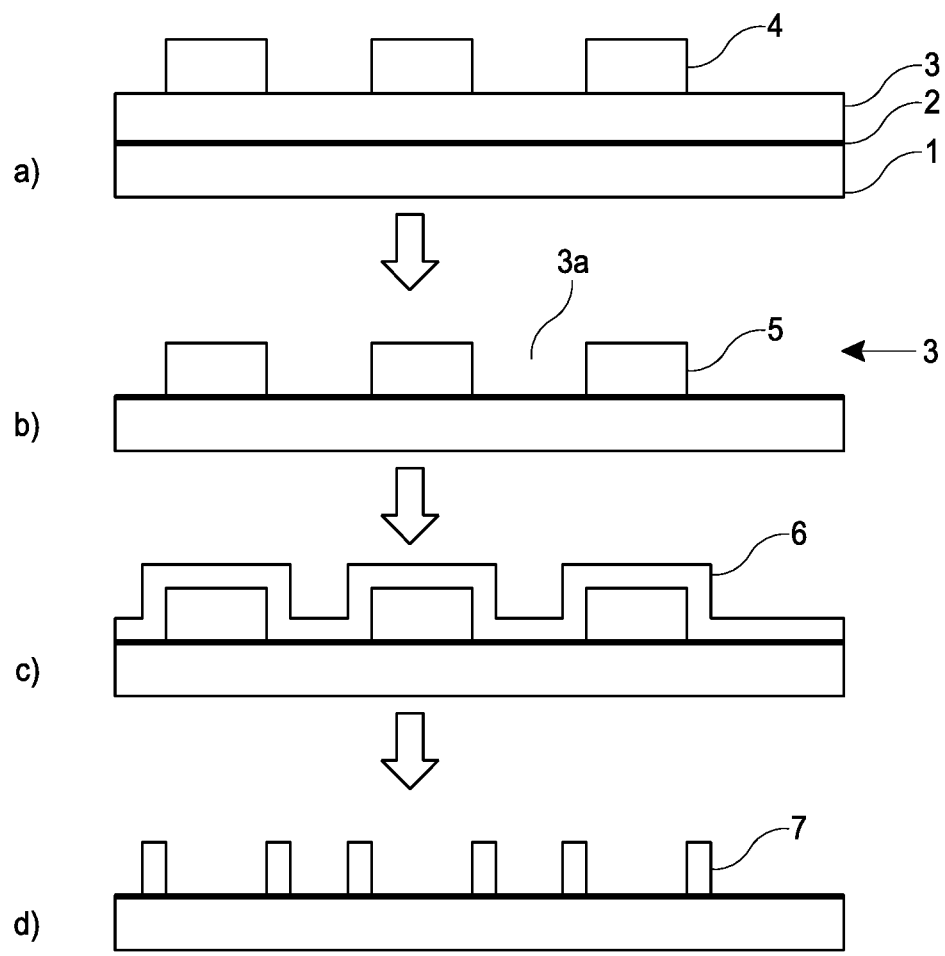
FIG. 6 shows an example of a process flow using an etch stop layer.

It will be appreciated that etch stop layers according to embodiments herein may be used in various process flows for fabricating integrated circuits. An example of a process flow is illustrated in FIG. 6. In a) a substrate 1 is covered by an etch stop layer 2, which may be formed according to embodiments herein. In some embodiments, the substrate is a silicon substrate and the etch stop layer 2 is a TaO layer. A target layer 3 is deposited on the etch stop layer 2 and an etch mask layer 5 is formed on the target layer 3. In some embodiments, the target layer 3 is formed of carbon, e.g., amorphous carbon, and the etch mask layer 4 is formed of carbon-doped silicon oxide. As illustrated, the etch mask layer 4 has been patterned, e.g., by pattern transfer from an overlying layer (not shown) that has since been removed.

The pattern in the etch mask layer 4 is then transferred to the target layer 3 by an ashing process comprising exposure to oxygen plasma. The etch mask layer 4 is removed to leave an exposed template 5, which has been formed in the target layer 3 by the pattern transfer from the etch mask layer 4, as shown in b). The ashing process completely removes the exposed areas of the target layer 3 to form one or more openings 3a extending completely through the target layer 3. As illustrated, the separate features of the template 5 may define a pattern formed by those separated features, with the openings 3a or open volumes between those features. As a result, the portions of the etch stop layer 2 that are exposed by the openings 3a were also exposed to oxygen plasma during the ashing process. Advantageously, the etch stop layer 2 is resistant to the oxygen plasma and protects the underlying substrate 1.

As shown in c), a blanket SiN spacer layer 6 is subsequently conformally deposited on the template 5, and the field areas in between the template features. Subsequently, the horizontal portions of the SiN layer 6 are directionally, e.g. anisotropically, etched, and the remaining portions of the template 5 are then removed, e.g. by a dry or wet etching process. Next, any remaining residue is removed by an HF etching process and a final template of spacers 7 is formed. Due to the properties of the etch stop layer 2, the combination of the ashing, dry etch process, and the liquid HF etch does not significantly etch the etch stop layer 2 and removes less than 0.3 nm of that etch stop layer 2, preferably less than 0.25 nm. As a result, no undercutting of the spacers 7 occurs. In some embodiments, the spacers 7 may subsequently be utilized as an etch mask to define features in the substrate 1. In some other embodiments, the spacers 7 may be retained to form part of a final semiconductor device.

It will be appreciated by those skilled in the art that various omissions, additions and modifications can be made to the processes and structures described above without departing from the scope of the invention. It is contemplated that various combinations or sub-combinations of the specific features and aspects of the embodiments may be made and still fall within the scope of the description. Various features and aspects of the disclosed embodiments can be combined with, or substituted for, one another in order. All such modifications and changes are intended to fall within the scope of the invention, as defined by the appended claims.

What is claimed is:

1. A method for making a semiconductor device comprising:
   providing a substrate;
   providing an etch stop layer over the substrate, wherein the etch stop layer comprises tantalum oxide;
   providing a target layer over the etch stop layer and an etch mask over the target layer; and
   exposing the etch stop layer to an oxygen plasma to etch the target layer through the etch mask.

2. The method of claim 1, further comprising exposing the etch stop layer to a fluorine-containing etch after exposing the etch stop layer to the oxygen plasma.

3. The method of claim 2, wherein exposing the etch stop layer to the fluorine-containing etch comprises exposing the etch stop layer to an aqueous HF solution.

4. The method of claim 3, wherein exposing the etch stop layer to the aqueous HF solution is performed for 1 minute or more.

5. The method of claim 1, wherein the etch stop layer comprises a cap layer of the tantalum oxide, the cap layer of tantalum oxide having a thickness of 0.5 to 2 nm.

6. The method of claim 1, further comprising an aluminum nitride or aluminum oxide layer underlying the etch stop layer comprising tantalum oxide.

7. The method of claim 1, wherein providing the etch stop layer comprises depositing tantalum oxide using a metalorganic precursor.

8. The method of claim 7, wherein the metalorganic precursor is tertiarybutylimido,tris(diethylamino)tantalum.

9. A method for making a semiconductor device comprising:
   providing a substrate;
   providing an etch stop layer over the substrate, wherein the etch stop layer comprises tantalum oxide and has a thickness of 0.5-2.0 nm;
   providing a target layer on the etch stop layer; and
   forming a pattern in the target layer, wherein forming the pattern comprises:
      exposing the target layer to an oxygen-containing plasma to form openings extending through the target layer, wherein the etch stop layer is exposed to the oxygen-containing plasma in the openings.

10. The method of claim 9, wherein, after exposing the etch stop layer to the oxygen-containing plasma, the etch stop layer is exposed to a fluorine-containing etch.

11. The method of claim 10, wherein exposing the etch stop layer to the fluorine-containing etch comprises exposing the etch stop layer to an aqueous HF solution.

12. The method of claim 10, wherein 0.3 nm or less of the etch stop layer is removed by exposing the target layer to an oxygen-containing plasma and by exposing the etch stop layer to the fluorine-containing etch.

13. A method for making a semiconductor device comprising:
   providing a substrate;
   providing an etch stop layer over the substrate, the etch stop layer having a thickness of 0.5-2.0 nm;
   exposing the etch stop layer to an oxygen-plasma; and
   exposing the etch stop layer to hydrogen fluoride,
   wherein a thickness of 0.3 nm or less of the etch stop layer is removed by exposing the etch stop layer to an oxygen-plasma and exposing the etch stop layer to hydrogen fluoride.

14. The method of claim 13, further comprising:
   providing a target layer over the etch stop layer;
   providing an etch mask having a pattern over the target layer; and
   transferring the pattern in the etch mask to the target layer by etching the target layer with the oxygen-containing plasma.

15. The method of claim 14, wherein exposing the etch stop layer to the hydrogen fluoride is performed after etching the target layer with the oxygen-containing plasma.

16. The method of claim 15, further comprising:
removing the etch mask after transferring the pattern;
subsequently depositing a spacer layer on the patterned target layer; and
directionally etching the spacer layer to define spacers along sidewalls of the pattern target layer,
wherein exposing the etch stop layer to the hydrogen fluoride is performed after directionally etching the spacer layer and wherein exposing the etch stop layer to the hydrogen fluoride removes the patterned target layer to leave a plurality of stand alone spacers.

17. The method of claim 13, wherein exposing the etch stop layer to hydrogen fluoride is performed for one minute or more.

18. The method of claim 13, wherein the etch stop layer comprises a metal oxide comprising a metal chosen from elements of Groups 4, 5, and 6 of the periodic table.

* * * * *